(12) United States Patent
Jain et al.

(10) Patent No.: US 12,328,880 B2
(45) Date of Patent: Jun. 10, 2025

(54) HIERARCHICAL MEMORY ARCHITECTURE INCLUDING ON-CHIP MULTI-BANK NON-VOLATILE MEMORY WITH LOW LEAKAGE AND LOW LATENCY

(71) Applicant: GlobalFoundries U.S. Inc., Malta, NY (US)

(72) Inventors: Navneet K. Jain, Milpitas, CA (US); Shashank S Nemawarkar, Austin, TX (US); Bipul C. Paul, Mechanicville, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 65 days.

(21) Appl. No.: 18/470,314

(22) Filed: Sep. 19, 2023

(65) Prior Publication Data

US 2025/0098177 A1  Mar. 20, 2025

(51) Int. Cl.
*G11C 11/00* (2006.01)
*G11C 11/4074* (2006.01)
(Continued)

(52) U.S. Cl.
CPC .......... *H10B 61/22* (2023.02); *G11C 11/4074* (2013.01); *G11C 11/4125* (2013.01); *G11C 11/5607* (2013.01); *G11C 2211/5643* (2013.01)

(58) Field of Classification Search
CPC .............. G11C 11/1675; G11C 11/161; G11C 13/0007; G11C 11/1673; G11C 2213/71;
(Continued)

(56) References Cited

U.S. PATENT DOCUMENTS 6,560,753 B2   5/2003   Barney et al.
8,099,556 B2   1/2012   Ghosh et al.
(Continued)

OTHER PUBLICATIONS

U.S. Appl. No. 17/533,402, Response to Office Action filed Mar. 19, 2024, 15 pages.
(Continued)

*Primary Examiner* — Thong Q Le
(74) *Attorney, Agent, or Firm* — David Cain; Hoffman Warnick LLC

(57) ABSTRACT

A disclosed non-volatile memory (NVM) structure is implemented in a fully depleted semiconductor-on-insulator technology processing platform and includes multiple NVM banks with NVM cells including transistors. NVM banks have well regions in a substrate. Transistors of NVM cells of each NVM bank are on an insulator layer above a corresponding well region for that bank. A bias control circuit causes well regions for NVM banks in a standby state to be biased with a reverse back biasing voltage and causes a well region for an NVM bank in an operational state to be biased with a forward back biasing voltage. The bias control circuit can initiate forward back biasing during a cache data retrieval process (before NVM bank access) to ensure that the corresponding well region of an NVM bank at issue is fully biased when, following the cache data retrieval process, access to the NVM bank is still required.

20 Claims, 6 Drawing Sheets

(51) Int. Cl.
*G11C 11/412* (2006.01)
*G11C 11/56* (2006.01)
*H10B 61/00* (2023.01)

(58) Field of Classification Search
CPC .............. G11C 11/401; G11C 13/0002; G11C 29/12005; G11C 29/1201; G11C 29/48; G11C 29/50; G11C 29/50016; G11C 5/063; G11C 5/066; G11C 11/54; G11C 13/004; G11C 13/0069; G11C 14/0036; G11C 14/0081; G11C 5/04; G11C 11/405; G11C 11/4076; G11C 11/5607; G11C 15/02; G11C 15/046; G11C 19/28; G11C 2211/4016; G11C 5/02; G11C 5/025; G11C 8/04; G11C 8/12; G11C 11/165; G11C 11/1659; G11C 13/00; G11C 13/0004; G11C 13/0021; G11C 13/0026; G11C 13/0028; G11C 2213/72; G11C 13/0014; G11C 13/0019; G11C 13/025; G11C 11/16; G11C 11/1653; G11C 11/407; G11C 11/4074; G11C 13/0023; G11C 2207/2227; G11C 7/1006; G11C 13/02; G11C 14/009; G11C 16/0475; G11C 2213/32; G11C 2213/77; G11C 11/5621; G11C 13/003; G11C 14/00; G11C 16/04; G11C 16/0466; G11C 16/0483; G11C 16/10; G11C 16/14; G11C 16/26; G11C 16/3427

See application file for complete search history.

(56) References Cited

U.S. PATENT DOCUMENTS

| | | | |
|---|---|---|---|
| 8,552,500 | B2 | 10/2013 | Dennard et al. |
| 9,697,874 | B1 * | 7/2017 | Asnaashari ............ H10B 63/30 |
| 10,068,918 | B2 | 9/2018 | Haufe et al. |
| 10,360,334 | B2 | 7/2019 | Jain et al. |
| 10,909,298 | B1 | 2/2021 | Chan et al. |
| 2002/0057610 | A1 | 5/2002 | Baliga |
| 2005/0051801 | A1 | 3/2005 | Shaw et al. |
| 2011/0049631 | A1 | 3/2011 | Itaka |
| 2014/0183602 | A1 | 7/2014 | Gurumurthy |
| 2014/0306319 | A1 | 10/2014 | Torii |
| 2017/0194319 | A1 | 7/2017 | Xu et al. |
| 2017/0330899 | A1 | 11/2017 | Yuan et al. |
| 2018/0225406 | A1 | 8/2018 | Jain et al. |

OTHER PUBLICATIONS

U.S. Appl. No. 17/533,402, Office Action dated Jan. 30, 2024, 26 pages.
Anonymous et al., "Advanced Caching Techniques," CSE P548-Advanced Caching Techniques, Autumn 2006, 11 pages.
Anonymous et al., "The Logic of the Cache access in Detail," retrieved from https://sabercomlogica.com/en/the-logic-of-the-cache-access-in-detail/ on Aug. 31, 2023, 7 pages.
Do et al., "Aggressive Leakage Current Reduction for Embedded MRAM Using Block-Level Power Gating, " IECON, IEEE Oct. 2020 the 46th Annual Conference of the IEEE Industrial Electronics Society, pp. 2249-2254.
U.S. Appl. No. 17/445,461, filed Aug. 19, 2021, 41 pages.
Jain et al., "Low Cost and Highly Manufacturable MOL/BEOL Constructs in 22FDSOI Technology for High Performance and Low Power Applications," 2018, IEEE Electron Devices Technology and Manufacturing Conference Proceedings of Technical Papers, downloaded on Jan. 12, 2022 from IEEE Xplore, pp. 91-93.
Jones et al., "The Memory Subsystem," Part of CS:2630, Computer Organization Notes, The University of Iowa Department of Computer Science, retrieved from: https://homepage.cs.uiowa.edu/~dwjones/assem/notes/14memory.shtml on May 31, 2023, 16 pages.
Marinelli et al., "Microarchitectural Exploration of STT-MRAM Last-level Cache Parameters for Energy-efficient Devices," ACM Transactions on Embedded Computing Systems, vol. 21, No. 1, Article 3, Published Jan. 2022, 20 pages.
U.S. Appl. No. 17/533,402, filed Nov. 23, 2021, 26 pages.
Desikan et al., "On-chip MRAM as a High-Bandwidth, Low-Latency Replacement for DRAM Physical Memories," Submitted to the 35th International Symposium on Microarchitecture, Computer Science Department, University of Texas at Austin, Sep. 27, 2002, 13 pages.

* cited by examiner

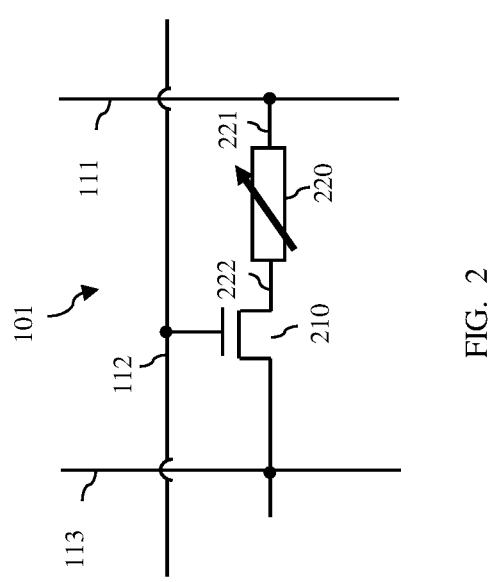
FIG. 2
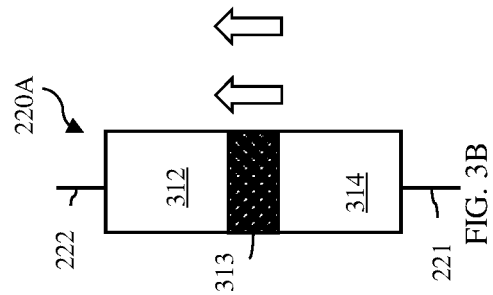
FIG. 3A
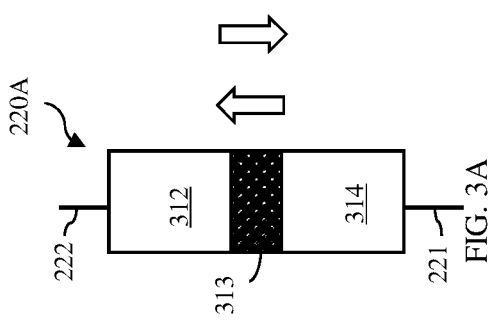
FIG. 3B
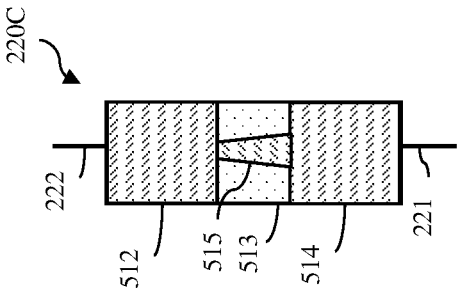
FIG. 4A
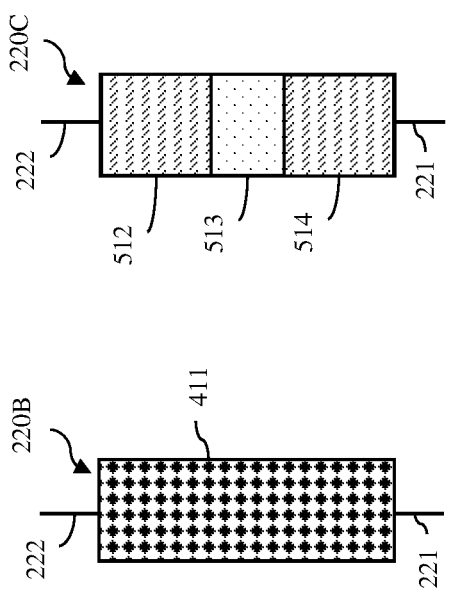
FIG. 4B
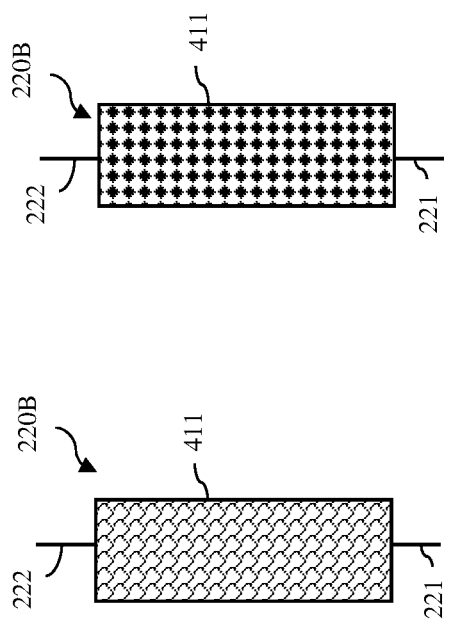
FIG. 5A
FIG. 5B

HIERARCHICAL MEMORY ARCHITECTURE INCLUDING ON-CHIP MULTI-BANK NON-VOLATILE MEMORY WITH LOW LEAKAGE AND LOW LATENCY

BACKGROUND

The present disclosure relates to hierarchical memory architectures and, particularly, to embodiments of a hierarchical memory architecture including an on-chip multi-bank non-volatile memory (NVM) structure with low leakage and low latency.

Integration of on-chip multi-bank NVM structures (e.g., on-chip multi-bank magnetic random access memory (MRAM) structures, etc.) into hierarchical memory architectures have been proposed. However, the memory banks of such multi-bank NVM structures are often very large (e.g., on the order of megabytes). Thus, the multi-bank NVM structures may suffer from significant leakage power consumption during a standby state (i.e., when not being accessed). One technique to reduce leakage power consumption is to switch all standby memory banks into a deep power down mode. Unfortunately, when a standby/powered down memory bank switches back to an operational state (e.g., for a read or write access), powering back up takes time and, thus, reduces operating speed (i.e., increases data access latency).

SUMMARY

Disclosed herein are embodiments of a structure and, particularly, a hierarchical memory architecture. The structure can include well regions within a semiconductor substrate and an insulator layer on the semiconductor substrate over the well regions. The structure can further include multiple memory banks. Each memory bank can include a corresponding well region of the multiple well regions. Each memory bank can also include an array of non-volatile memory (NVM) cells and the NVM cells can include transistors on the insulator layer above the corresponding well region. The structure can further include a bias control circuit connected to the each of the well regions. The bias control circuit can output back biasing voltages for the memory banks to the well regions. The bias control circuit can further independently switch these back biasing voltages between a reverse back biasing voltage and a forward back biasing voltage.

In some embodiments, the structure can include well regions within a semiconductor substrate and an insulator layer on the semiconductor substrate over the well regions. The structure can further include multiple memory banks. Each memory bank can include a corresponding well region of the well regions. Each memory bank can include an array of NVM cells and the NVM cells can include transistors on the insulator layer above the corresponding well region. The structure can further include a bias control circuit connected to the well regions. The bias control circuit can output back biasing voltages for the memory banks to the well regions. The bias control circuit can further independently switch the back biasing voltages between a reverse back biasing voltage and a forward back biasing voltage based on addresses in access requests and based on results of cache data retrieval processes performed in response to the access requests.

In some embodiments, the structure can include well regions within a semiconductor substrate and an insulator layer on the semiconductor substrate over the well regions. The structure can further include multiple memory banks. Each memory bank can include a corresponding well region of the well regions. Each memory bank can further include an array of NVM cells and the NVM cells can include transistors on the insulator layer above the corresponding well region. The structure can further include a bias control circuit. The bias control circuit can include bias voltage selectors and logic blocks for the memory banks. The bias voltage selectors for the memory banks can be electrically connected to the well regions for the memory banks, respectively, and the logic blocks for the memory banks can be electrically connected to the bias voltage selectors for the memory banks, respectively. The structure can further include a cache controller connected to the logic blocks. In operation, the bias voltage selectors can output back biasing voltages for the memory banks to the well regions and the logic blocks can cause the bias voltage selectors to independently switch the back biasing voltages between a reverse back biasing voltage and a forward back biasing voltage based on addresses in access requests and further in response to inputs received from the cache controller indicating results of cache data retrieval processes performed in response to the access requests.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which:

FIG. 2 is a schematic diagram illustrating an example of a resistance-programmable NVM cell that can be incorporated into the NVM structure of FIG. 1B;

FIGS. 3A-3B illustrate an example of a magnetic tunnel junction (MTJ)-type programmable resistor that can be incorporated into the NVM cell of FIG. 2;

FIGS. 4A-4B illustrate an example of a phase change memory (PCM)-type programmable resistor that can be incorporated into the NVM cell of FIG. 2;

FIGS. 5A-5B illustrate an example of a resistive random access memory (RRAM)-type programmable resistor that can be incorporated into the NVM cell of FIG. 2;

DETAILED DESCRIPTION

Figure 1A:
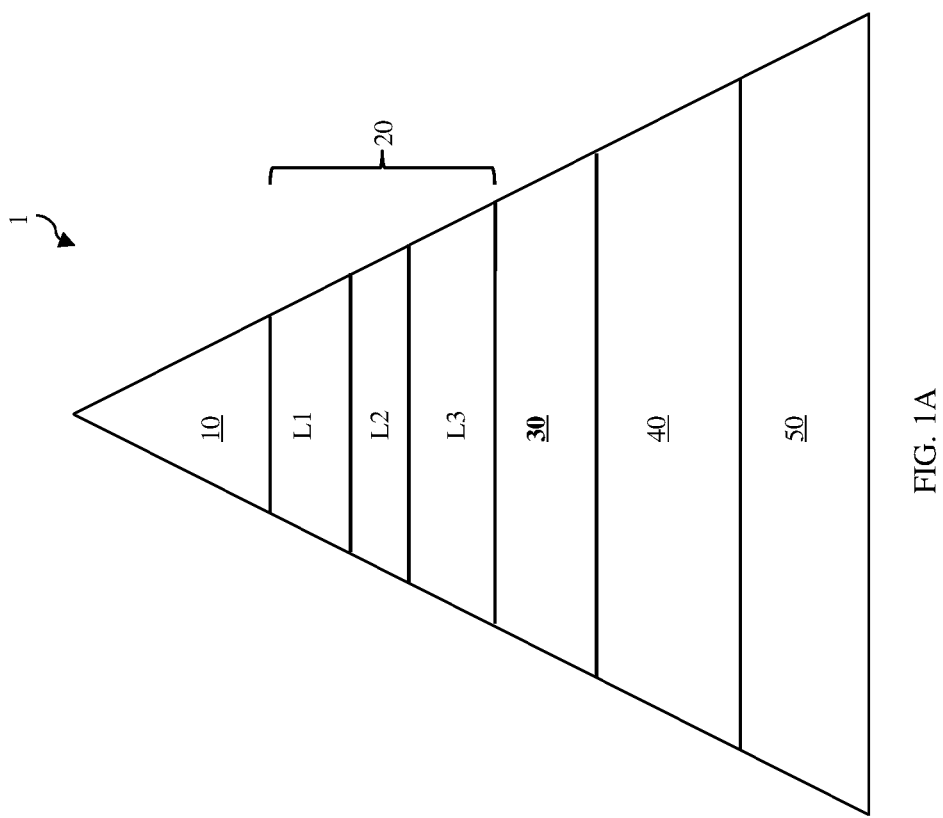
FIG. 1A is a diagram illustrating a disclosed hierarchical memory architecture.

As mentioned above, integration of on-chip multi-bank NVM structures (e.g., on-chip multi-bank magnetic random access memory (MRAM) structures, etc.) into hierarchical memory architectures have been proposed. However, the memory banks of such multi-bank NVM structures are often very large (e.g., on the order of megabytes). Thus, the multi-bank NVM structures may suffer from significant leakage power consumption during a standby state (i.e., when not being accessed). One technique for reducing leakage power consumption is to switch all standby memory banks into a deep power down mode. Unfortunately, when a standby/powered down memory bank switches back to an operational state (e.g., for a read or write access), powering back up takes time and, thus, reduces operating speed (i.e., increases data access latency).

In view of the foregoing disclosed herein are embodiments of a hierarchical memory architecture including an on-chip multi-bank non-volatile memory (NVM) structure implemented in a fully depleted semiconductor-on-insulator (e.g., fully depleted silicon-on-insulator (SOI) technology processing platform). The multi-bank NVM structure can include multiple NVM banks. Each NVM bank can include an array of NVM cells and each NVM cell can include at least one transistor (e.g., an N-type field effect transistor (NFET)). The NVM banks can have corresponding well regions in a semiconductor substrate with the transistors of all NVM cells of each NVM bank being on an insulator layer and aligned above a corresponding well region for that NVM bank. A bias control circuit can be connected to the well regions to enable for independent biasing of those well regions. Specifically, the bias control circuit can be configured, as discussed in greater detail below, to cause the well regions for NVM banks that are in a standby state (i.e., not being accessed) to be biased with a reverse back biasing voltage in order to reverse back bias the transistors above those well regions for reduced leakage power consumption and to cause a well region for an NVM bank in an operational state (i.e., being accessed) to be biased with a forward back biasing voltage in order to forward back bias the transistors above that well region for reduced data access latency. It should be understood that if the transistors of the NVM cells are N-type field effect transistors (NFETs) (as illustrated), then the reverse back biasing voltage is a negative voltage and the forward back biasing voltage is a positive voltage. If the transistors of the NVM cells are P-type field effect transistors (PFETs) (not shown), then the reverse back biasing voltage is a positive voltage and the forward back biasing voltage is a negative voltage. Additionally, in some embodiments, the bias control circuit can be configured to initiate forward back biasing near the beginning of a cache data retrieval process (which is performed in a hierarchical memory architecture) prior to accessing of a NVM bank in order to ensure that the well region of the NVM bank at issue (as indicated by an address specified in the same access request that triggered the cache data retrieval process) is fully biased when, following the cache data retrieval process, access to the NVM bank is still required because duplicate data associated with the specified address was not found in a cache. Timing the switch to the forward back biasing voltage in this manner further reduces data access latency.

Figure 1B:
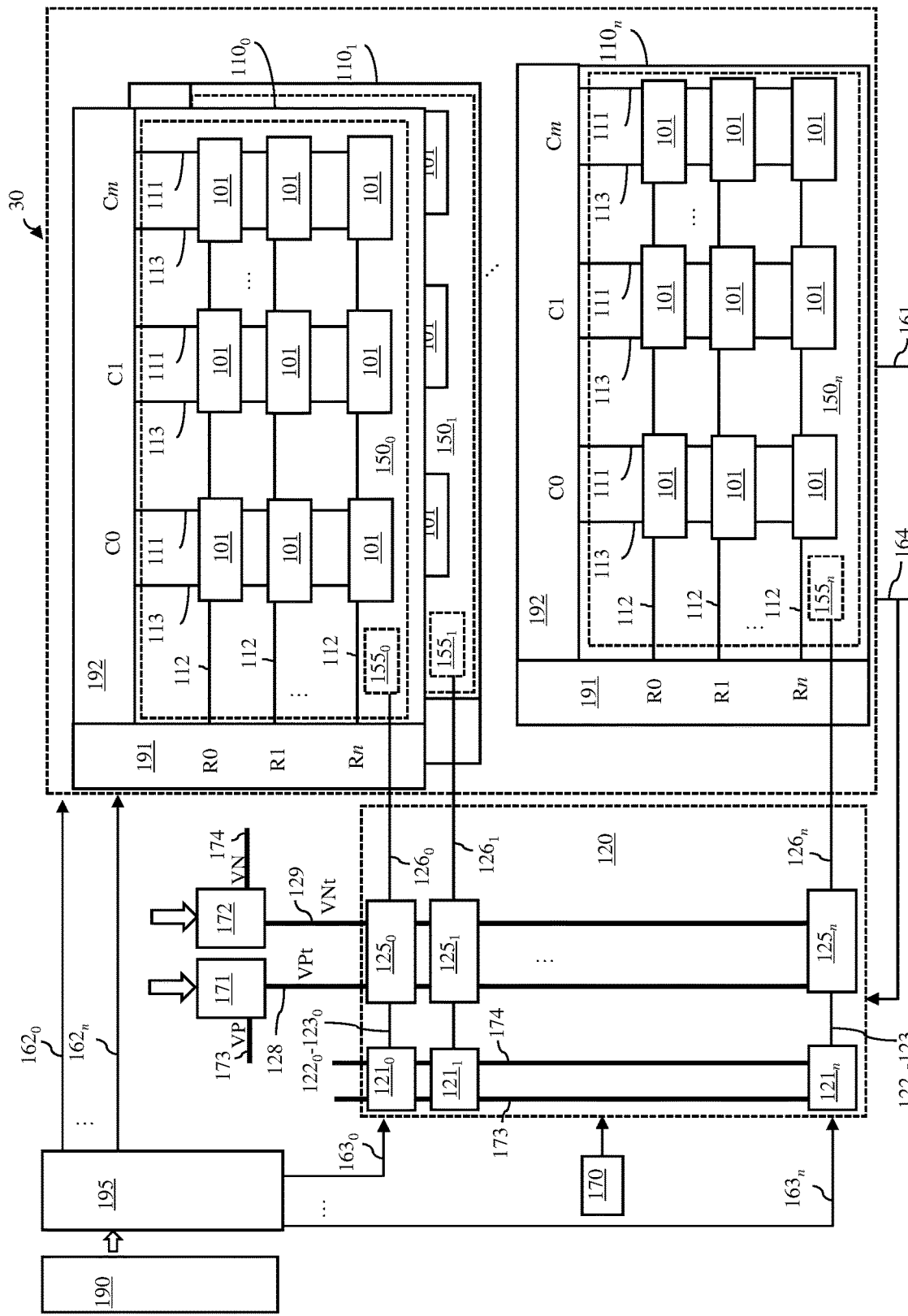
FIG. 1B is a schematic diagram illustrating an on-chip multi-bank NVM structure within the hierarchical memory architecture of FIG. 1A.

More particularly, FIG. 1A is a diagram illustrating a disclosed hierarchical memory architecture 1 (also referred to herein as a hierarchical memory system) and FIG. 1B is a schematic diagram illustrating a novel one of the memory components and, particularly, a novel on-chip multi-bank NVM structure 30 within the hierarchical memory architecture 1.

Those skilled in the art will recognize that in a computer system oftentimes includes a hierarchical memory architecture to organize the various memory components thereof and minimize access time. In the disclosed embodiments, the hierarchical memory architecture 1 can include primary memory including, for example, computer processing unit (CPU) registers 10, one or more cache memories 20 (e.g., see first cache (L1), second cache (L2), and third cache (L3)), the multi-bank NVM structure 30, and a main memory 40 (e.g., a dynamic random access memory (DRAM) structure). Registers 10 are small, fast structures used to store frequently used data and instructions. Caches L1-L3 are similarly small, fast structures (e.g., static random access memories (SRAMs) or other volatile memories) used to store recently accessed data and instructions. The main memory 40 (e.g., a dynamic random access memory (DRAM)) has a larger storage capacity but is slower than the registers and caches. Generally, the multi-bank NVM structure 30 will have a larger storage capacity and slower operating speed than the registers 10 and cache memory 20 but will have a smaller storage capacity and faster operating speed than the main memory 40. Registers 10, cache memory 20, and main memory 40 of the primary memory of hierarchical memory architecture 1 are well known memory components and, thus, the details thereof have been omitted from this specification in order to allow the reader to focus on the salient aspects of the disclosed embodiments. The novel on-chip multi-bank NVM structure 30 is described in greater detail below and illustrated in FIG. 1B. The hierarchical memory architecture 1 can also include secondary memory including, but not limited to, storage memory 50 (such as solid state drive (SSD), hard disk drive (HDD), etc.).

Those skilled in the art will recognize that, in a typical read or write access operation, a hierarchical memory architecture 1 will receive an access request accompanied by a memory address. For a read access request accompanied by a specific address, a series of data retrieval processes can be automatically performed. First, a register data retrieval process (e.g., controlled by a register controller) can be automatically performed in order to determine if duplicate data (associated with the specific address) is stored in the registers 10. If not, the register controller can output a register miss indicator. The register miss indicator can trigger a cache data retrieval process (e.g., controlled by a cache controller). The cache data retrieval process can be automatically performed in order to determine if duplicate data (associated with the specific address) is stored in any of the caches. In this cache data retrieval process, the different caches (L1, L2, etc.) can be accessed sequentially. For example, an L1 data retrieval process can be performed. If duplicate data (associated with the address) is not stored in L1, an L1 miss indicator can be output. The L1 miss indicator can trigger an L2 data retrieval process and so on. If duplicate data (associated with the specific address) is not in any of the caches, then a last cache miss indicator (e.g., an L3 miss indicator) can be output. The last cache miss indicator can trigger a multi-bank NVM structure data retrieval process, etc. If at any point in these data retrieval processes, duplicate data (associated with the specific address) is found, then a corresponding cache hit indicator (also referred to herein as a cache-specific hit indicator) (e.g., register hit indicator, L1 hit indicator, etc.) can be output, thereby causing subsequent data retrieval processes to be halted. In any case, with each data retrieval process, data access latency increases. By inserting the multi-bank NVM structure 30 into the hierarchical memory architecture 1, data access latency can be decreased over the latency that would otherwise occur if no such NVM structure was between the cache memory 20 and the main memory 40. Furthermore, as described in greater detail below, the novel multi-bank NVM structure 30 includes additional features for reducing leakage power consumption without increasing data access latency (or at least only minimally increasing data access latency).

More particularly, FIG. 1B is a schematic diagram illustrating an example of an on-chip multi-bank NVM structure 30 that can be incorporated into the hierarchical memory architecture 1 of FIG. 1A. This on-chip multi-bank NVM structure 30 can include, for example, multiple NVM banks $110_0$-$110_n$.

Each NVM bank $110_0$-$110_n$ can include an array of NVM cells 101. The NVM cells 101 can be arranged in columns (e.g., see columns C0-Cm) and rows (e.g., see rows R0-Rn). For purposes of illustration, the columns are shown on the drawing sheet as being oriented in the Y-direction (i.e., from top to bottom) and the rows are shown on the sheet as being oriented in the X-direction (i.e., from side to side). The orientation of the columns and rows of the NVM cells 101 as shown in the figures is not intended to be limiting. Alternatively, the columns could be oriented in the X-direction and the rows could be oriented in the Y-direction. In any case, the columns can be essentially perpendicular to the rows with each memory cell 101 being at an address within the memory bank at an intersection between one column and one row.

Each NVM bank $110_0$-$110_n$ can further include bitlines 111 and source line 113 for the columns C0-Cm, respectively, and wordlines 112 for the rows R0-Rn, respectively. All NVM cells 101 in each column can be electrically connected between a source line 113 and a bitline 111 for that column. All NVM cells 101 in each row can be electrically connected to the wordline 112 for that row.

FIG. 2 is a schematic diagram illustrating an example resistance-programmable NVM cell including a programmable resistor 220 (also referred to herein as a variable resistor) and an access transistor 210 connected in series between a bitline 111 for a column and a source line 113 for the same column. Specifically, the programmable resistor 220 can have a first terminal 221 connected to the bitline 111 for the column and a second terminal 222 connected to the drain region of the access transistor 210. The access transistor 210 can be, for example, an N-type field effect transistor (NFET) with a source region can be connected to the source line 113 for the column and with a gate connected to a wordline 112 for the row.

In such resistance-programmable NVM cells, the programmable resistor 220 can be any type of programmable resistor 220 suitable for use in a resistive NVM cell. For example, the programmable resistor 220 could be a magnetic tunnel junction (MTJ)-type programmable resistor (for a magnetic random access memory (MRAM) cell), a phase change memory (PCM)-type programmable resistor (for a PCM cell), or a resistive random access memory (RRAM)-type programmable resistor (for an RRAM cell) or any other suitable type of programmable resistor that is configured so that, by applying specific bias conditions to one or both of the two terminals, the resistance of the resistor can be changed between at least two different stable resistance states. For example, the resistance state of such a programmable resistor can be changed to a high resistance state to store one logic value (e.g., a logic value of "1") or to a low resistance state to store a different logic value (e.g., a logic value of "0").

FIGS. 3A-3B illustrate an example of an MTJ-type programmable resistor 220A for an MRAM cell (i.e., one type of NVM cell). Such an MTJ-type programmable resistor 220A is typically a back end of the line (BEOL) multi-layer structure, which includes a free ferromagnetic layer 314 (also referred to as a switchable layer) at the first terminal 221 and a fixed ferromagnetic layer 312 (also referred to as a pinned layer) at the second terminal 222 and separated from the free ferromagnetic layer 314 by a thin dielectric layer 313 (e.g., a thin oxide layer). Depending upon the biasing conditions on the first terminal 221 and the second terminal 222 during a write operation, the MTJ-type programmable resistor 220A exhibits different resistances (e.g., a low resistance or a high resistance). For example, during a write operation, a high positive voltage (VDD) can be applied to the second terminal 222 and the first terminal 221 can be discharged to ground (e.g., at 0V). In this case, current flow causes the free layer to switch to (or maintain) the anti-parallel resistance (RAP) state (also referred to as a high resistance state), thereby storing one logic value (e.g., a logic value of "1") (see FIG. 3A). Alternatively, during the write operation, VDD can be applied to the first terminal 221 and the second terminal 222 can be discharged to ground (e.g., at 0V). In this case, current flow causes the free layer to switch to (or maintain) a parallel resistance (RP) state (also referred as a low resistance state), thereby storing another logic value (e.g., a logic value of "0") (see FIG. 3B).

FIGS. 4A-4B illustrate an exemplary PCM-type programmable resistor 220B of a PCM cell (i.e., another type of NVM cell). Such a PCM-type programmable resistor employs a phase change material 411 (e.g., a chalcogenide compound) with programmable structural phases that exhibit different resistances. Switching of the phase is dependent upon the local temperature, which is controlled by the length and strength of an applied voltage. For example, switching from a crystalline to an amorphous phase to store one logic value (e.g., a logic value of "1") can be achieved by applying a short high voltage pulse to one or both of the terminals 221-222 to quickly heat the phase change material above its melting point (see FIG. 4A). Switching from an amorphous phase to the crystalline phase to store another logic value (e.g., a logic value of "0") can be achieved by applying a longer lower voltage pulse to one or both of the terminals 221-222 in order to heat the phase change material to its crystallization temperature and then allowing it to cool (see FIG. 4B).

FIGS. 5A-5B illustrate an exemplary RRAM-type programmable resistor 220C of an RRAM cell (i.e., yet another type of NVM cell). Such an RRAM-type programmable resistor is also typically a back end of the line (BEOL) multi-layer structure, which includes two metal layers 512 and 514 separated by a dielectric layer 513 (e.g., hafnium oxide ($HfO_x$) or some other suitable oxide layer, also referred to as a switching layer). Depending upon the biasing conditions on the first terminal 221 and the second terminal 222 during a write operation, ions in the dielectric layer 513 may migrate to: (a) either break-up a conductive filament between the metal layers 512 and 514 so that the memristor is in a high resistance state, thereby storing one logic value (e.g., a logic value of "1") (see FIG. 5A) or (b) grow a conductive filament 515 in the dielectric layer 513 and extending between the metal layers 512 and 514 so that the memristor is in a low resistance state, thereby storing a different logic value (e.g., a logic value of "0") (see FIG. 5B).

Referring again to FIG. 1B, multi-bank NVM structure 30 can further include a global memory controller 190 and, in communication with the controller 190, peripheral circuitry including, but not limited to, a pre-decoder 195 and row and column control blocks 191-192 for each NVM bank $110_0$-$110_n$. In operation, the pre-decoder 195 can receive (e.g., from the controller 190) a memory address associated with an access request (e.g., a read access request for data stored within the hierarchical memory architectures 1). The memory address can include information indicative of where the desired data could be stored (e.g., including information indicative of which one of the NVM banks and which NVM cell location (column/row) the desired data could be stored).

For example, the NVM structure can be partitioned into NVM banks by splitting up the rows. That is, the NVM structure can include a total number of rows (wordlines) with the first NVM bank including the first k rows, the second NVM bank including the second k rows, and so on. Each of the NVM banks will have the same number of columns. The memory address received by the pre-decoder 195 can indicate the row number of the total number of rows and the pre-decoder 195 can, in turn, pre-decode the row memory address (based on the row number) to determine a particular NVM bank $110_0$-$110_n$ associated the access request and can further output row address information $162_0$-$162_n$ for the access request to the appropriate one of the NVM banks $110_0$-$110_n$ and output bank address information $163_0$-$163_n$ to a bias control circuit 120 (discussed in greater detail below). Additional information provided to the NVM banks $110_0$-$110_n$ can optionally include the access request type and/or a request identifier.

Within each NVM bank $110_0$-$110_n$, the row address information $162_0$-$162_n$ can be received by the peripheral circuitry. The row control block 191 (which is electrically connected to the wordlines 112 for the rows therein) can include, but is not limited to, address decode logic and wordline drivers for appropriately switching wordline select signals (WLs) applied to the wordlines 112 therein (e.g., depending on the received information). The column control block 192, as mentioned above, is electrically connected to bitlines 111 and source lines 113 for the columns. It can include, but is not limited to, column address decode logic, bitline and source line drivers and a sensing circuit for appropriately biasing bitlines 111 and source lines 113 therein (e.g., depending on the information contained in the received information) and for sensing stored data in a selected NVM cell and outputting a data out signal (Dout) 161 during a read operation, as applicable. Such peripheral circuitry (e.g., pre-decoders, row control blocks, column control blocks, etc.) for multi-bank NVM structures is well known in the art and, thus, the details thereof have been omitted from this specification in order to allow the reader to focus on the salient aspects of the disclosed embodiments (e.g., related to back biasing in fully depleted semiconductor-on-insulator (e.g., FDSOI) implementations for low leakage power consumption and low data access latency, as described in greater detail below).

Figure 6:
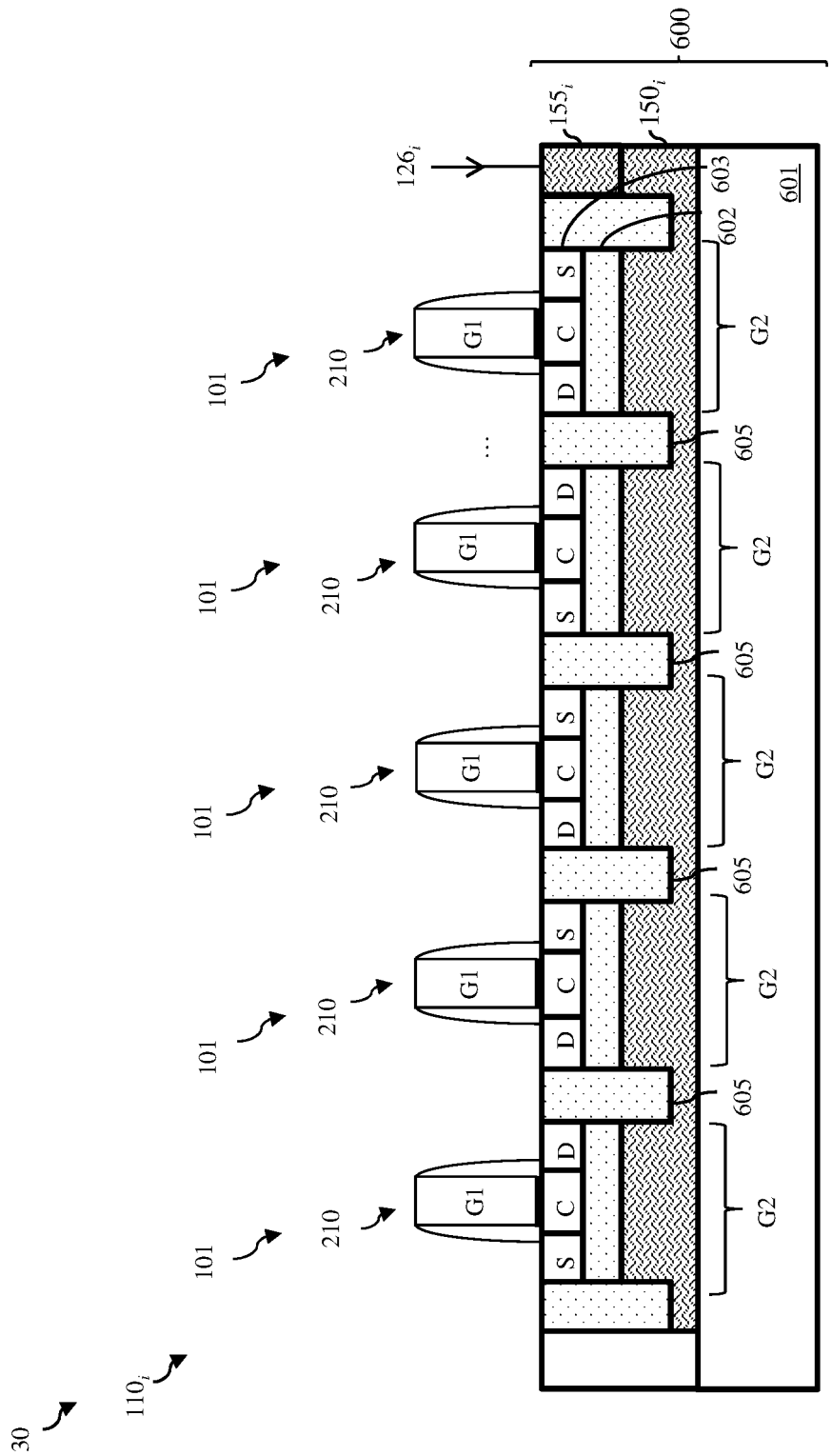
FIG. 6 is a cross-section diagram illustrating a fully-depleted semiconductor-on-insulator structure on which the disclosed embodiment can be implemented.

Referring to FIG. 6 in combination with FIGS. 1A-1B, in the disclosed embodiments, multi-bank NVM structure 30 can be implemented as a semiconductor-on-insulator structure 600 using a fully depleted semiconductor-on-insulator technology processing platform (e.g., using a fully-depleted silicon-on-insulator (FDSOI) technology processing platform). The multi-bank NVM structure 30 can include a semiconductor substrate 601. Semiconductor substrate 601 can be, for example, a monocrystalline silicon substrate or a substrate of any other suitable monocrystalline semiconductor material (e.g., silicon germanium, etc.). The multi-bank NVM structure 30 can further include semiconductor-on-insulator regions (e.g., SOI regions). Semiconductor-on-insulator regions can include an insulator layer 602 on semiconductor substrate 601. Insulator layer 602 can be, for example, a thin silicon dioxide layer or a relatively thin layer of any other suitable insulator material. Semiconductor-on-insulator regions can further include a thin semiconductor layer 603 on insulator layer 602. Semiconductor layer 603 can be, for example, a monocrystalline silicon layer or a layer of any other suitable monocrystalline semiconductor material (e.g., silicon germanium, etc.).

Each NVM bank $110_0$-$110_n$ (e.g., NVM bank $110_i$) in the multi-bank NVM structure 30 can include an array of NVM cells 101. Since each NVM cell 101 includes a transistor 210 (e.g., an NFET) in addition to a programmable resistor, each NVM bank $110_0$-$110_n$ also includes an array of transistors (also referred to herein as a transistor array) for the NVM cells therein. The transistor arrays can be on the insulator layer 602 above the well regions $150_0$-$150_n$, respectively. For purposes of illustration, FIG. 6 shows a cross-section diagram of a portion of a transistor array for an NVM cell array of one NVM bank (referred to as NVM bank $110_i$) in the multi-bank NVM structure 30. It should be understood that some features of the NVM cells 101 in the NVM bank $110_i$ (e.g., programmable resistors 220, middle of the line (MOL) components, back end of the line (BEOL) components, etc.) have been omitted from FIG. 6 in order to avoid clutter in the drawings and to allow the reader to focus on the salient aspects of the disclosed embodiments related to FDSOI implementation.

As illustrated, each transistor 210 can include an active device region in a corresponding portion of semiconductor layer 603. The boundaries of the corresponding portions of semiconductor layer 603 (and thereby the boundaries of the active device regions) can be defined by isolation regions 605. Isolation regions 605 can be, for example, shallow trench isolation (STI) regions. That is, trenches can extend from the top surface of semiconductor layer 603 to and optionally through insulator layer 602, can laterally surround the active device regions of the transistors, and can be filled with one or more layers of isolation materials (e.g., silicon dioxide, silicon nitride, silicon oxynitride, etc.). Each transistor 210 can further include, within its active device region, a channel region (C) between source and drain regions (S/D). For an NFET, the source/drain regions can have N-type conductivity at a relatively high conductivity level (e.g., can be N+ source/drain regions) and the channel region can be either intrinsic (i.e., undoped) or can have P-type conductivity at a relatively low conductivity level (e.g., can be an N-channel region). Each transistor 210 can further include a primary gate (G1) (also referred to herein as a front gate) adjacent to (e.g., above, and immediately adjacent to) the active device region at the channel region. The primary gate can include a relatively thin gate dielectric layer (including one or more layers of gate dielectric material) immediately adjacent to the channel region and a gate conductor layer (including one or more layers of gate conductor material) on the gate dielectric layer. Primary gates could be any of gate-first polysilicon gate structures, gate-first high-K metal gate (HKMG) structures, gate-last HKMG structures (also referred to as a replacement metal gate (RMG) structure), or any other suitable type of front gate structures. Fully depleted semiconductor-on-insulator (e.g., FDSOI) implemented FET structures are well known in the art. Thus, the details thereof as well as the process techniques for forming them have been omitted from this specification in order to allow the reader to focus on the salient aspects of the disclosed embodiments (e.g., the inventive features related to the bias control circuit 120 of the multi-bank NVM structure 30 and the biasing scheme employed for biasing the well regions during NVM structure operation, as discussed in greater detail below).

As mentioned above, the transistor arrays for the NVM cell arrays for the NVM banks $110_0$-$110_n$ can be on the insulator layer 602 above corresponding well regions $150_0$-$150_n$, respectively. More specifically, the multi-bank NVM structure 30 can include well regions $150_0$-$150_n$ for NVM banks $110_0$-$110_n$ within the semiconductor substrate 601 (e.g., see well region $150_i$ in the semiconductor substrate 601 aligned below the transistor array for the NVM cell array for the NVM bank $110_i$). For purposes of this disclosure, a well region (also referred to herein as a well) refers to a region of semiconductor material doped (e.g., via a dopant implantation process or any other suitable doping process) so as to have a particular type conductivity. A well region doped so as to have N-type conductivity is referred to herein as an Nwell and well region doped so as to have P-type conductivity is referred to herein as a Pwell (see different dopant used to achieve different type conductivities discussed below). In the disclosed embodiments, the well regions $150_0$-$150_n$ can be Nwells or Pwells. In the disclosed embodiment, each transistor 210 effectively includes a secondary gate G2 (also referred to herein as a back gate or supplementary gate) adjacent to (e.g., below, and immediately adjacent to) an active device region opposite a primary gate G1, respectively. The secondary gate includes adjacent portions of insulator layer 602 and well region $150_i$ below (e.g., defined by the isolation regions 605).

Those skilled in the art will recognize that one advantage of fully depleted semiconductor-on-insulator technology processing platforms (e.g., a FDSOI technology processing platform) is that transistors can be formed on the insulator layer above either an Nwell or a Pwell in order to achieve different threshold voltages (VTs). For example, for super low threshold voltage (SLVT) or low threshold voltage (LVT) FETs, NFETs can be formed above Nwells and PFETs can be formed above Pwells. For regular threshold voltage (RVT) or high threshold voltage (HVT) FETs, NFETs can be formed above Pwells and PFETs can be formed above Nwells. Typically, a circuit block will include all SLVT (or LVT) FETs with NFETs above Nwells and PFETs above Pwells or all RVT (or HVT) FETs with NFETs above Pwells and PFETs above Nwells. Thus, in the disclosed embodiments, if transistors 210 are NFETs and the well region $150_i$ is an Nwell, then the transistors 210 will be SLVT (or LVT) NFETs. However, if the transistors 210 are NFETs and the well region $150_i$ is a Pwell, then the transistors 210 will be RVT (or HVT) NFETs. Those skilled in the art will recognize that whether the FETs are SLVT or LVT FETs or whether they are RVT or HVT FETs will depend upon the design (e.g., device size, etc.) and process specifications (e.g., dopant concentrations, etc.). Another advantage is that back biasing (also referred to herein as back gate biasing) can be employed to fine tune the threshold voltages (regardless of whether the FETs are SLVT/LVT or RVT/HVT FETs. Forward back biasing (FBB) refers to applying a gate bias voltage to the back gate (particularly, to the well region thereof) to reduce the VT of a FET, thereby increasing the switching speed. Generally, for a PFET, FBB is achieved by applying 0.0 volts (V) or a negative gate bias voltage (VN) to the well region; whereas, for an NFET, FBB is achieved by applying a positive gate bias voltage (VP) to the well region. Reverse back biasing (RBB) refers specifically to applying a gate bias voltage to the back gate (particularly, to the well region thereof) to increase the VT of the FET, thereby decreasing the switching speed and reducing leakage current. Generally, for a PFET, RBB is achieved by applying VP to the well region; whereas, for an NFET, RBB is achieved by applying VN to the well region.

The well regions $150_0$-$150_n$ can have well contact regions $155_0$-$155_n$ (also referred to herein as well taps) immediately adjacent thereto (e.g., see contact region $155_i$ immediately adjacent to well region $150_i$). That is, multi-bank NVM structure 30 can further include bulk regions (also referred to as hybrid regions). The bulk regions can be devoid of the insulator layer 602 and instead can include one or more contact regions on the semiconductor substrate 601 immediately adjacent to each well region and electrically isolated from the active device regions of the transistors (e.g., by isolation regions 605). Each contact region $155_0$-$155_n$ can include, for example, an epitaxially grown monocrystalline semiconductor layer (e.g., an epitaxially grown silicon layer or an epitaxially grown layer of any other suitable semiconductor material) on the top surface of semiconductor substrate 601 immediately adjacent to a well region. Such contact regions (well taps) can be doped (e.g., in situ or subsequently implanted) so as to have the same type conductivity as the well region below, optionally at a higher conductivity level. For example, if well regions $150_0$-$150_n$ are Pwells, contact regions $155_0$-$155_n$ can be P+ contact regions. If well regions $150_0$-$150_n$ are Nwells, contact region $155_0$-$155_n$ can be N+ contact regions. Optionally, contact regions can further include silicide layers thereon (not shown). Back biasing can be achieved by applying back bias voltages to the contact regions $155_0$-$155_n$ and thereby to the well regions $150_0$-$150_n$, as discussed below.

The multi-bank NVM structure 30 can further include a bias control circuit 120. The bias control circuit 120 can have discrete outputs electrically connected to the contact regions $155_0$-$155_n$ and thereby to the well regions $150_0$-$150_n$, respectively. The bias control circuit 120 can output (i.e., can be configured to output) back biasing voltages $126_0$-$126_n$ to the contact regions $155_0$-$155_n$ and thereby to the well regions $150_0$-$150_n$. The bias control circuit 120 can further selectively and independently switch (i.e., can be configured to selectively and independently switch) the back biasing voltages $126_0$-$126_n$ between a reverse back biasing (RBB) voltage and a forward back biasing (FBB) voltage. Thus, all transistors 210 of all NVM cells 101 in any given one of the NVM banks $110_0$-$110_n$ can be either concurrently reverse back biased (with the RBB voltage) or concurrently forward back biased (with the FBB voltage) and the back bias voltage applied to any one of the well regions will be independent of that applied to any other ones of the well regions.

It should be noted that, in the disclosed embodiments, if transistors 210 are NFETs, the RBB voltage will be VNt or VN, whereas the FBB voltage will be VPt or VP. More specifically, in some embodiments, a maximum positive voltage supply line 173 set at a maximum positive supply voltage (VP) and a maximum negative voltage supply line 174 set at a maximum negative supply voltage (VN) could be directly connected to the bias control circuit 120 (not shown). Alternatively, as illustrated, a positive bias voltage generator 171 could be connected to the maximum positive supply voltage line 173 to receive VP and can be configured to receive positive voltage trim bits (PTBs) and, based on the received PTBs, output a trimmed VP (VPt, also referred to as a selectively adjusted VP) between 0.0V and VP on a positive voltage supply line 128 to the bias control circuit 120. Similarly, a negative bias voltage generator 172 could be connected to the maximum negative supply voltage line 174 and configured to receive negative voltage trim bits (NTBs) and, based on the received NTBs, output a trimmed VN (VNt, also referred to as a selectively adjusted VN) between 0.0V and VN on a negative voltage supply line 129.

The bias control circuit 120 can be configured so that the applied back biasing voltages $126_0$-$126_n$ result in a reduction in standby state leakage power consumption while also avoiding or at least minimizing data access latency. For example, the FBB voltage may only be applied to corresponding well region of an NVM bank to be accessed and the RBB voltage may be applied to corresponding well regions of all other NVM banks (e.g., all NVM banks in a standby state). Furthermore, since the multi-bank NVM structure 30 is incorporated into a hierarchical memory structure 1 the bias control circuit 120 can initiate (i.e., can be configured to initiate) forward back biasing of a well region for an NVM bank near the beginning of a cache data retrieval process as opposed to waiting until the beginning of the NVM bank data retrieval process. Early triggering of FBB ensures that the well region of the NVM bank at issue (as indicated by the memory address specified in an access request) is fully biased when, following the cache data retrieval process, access to the NVM bank is still required because duplicate data associated with the memory address was not found in any of the caches. Timing the switch of a back biasing voltage from the RBB voltage to the FBB voltage reduces data access latency.

To accomplish this, the bias control circuit 120 can include logic blocks $121_0$-$121_n$, which are electrically connected between a cache controller 170 (which controls cache data retrieval processing), and the bias voltage selectors $125_0$-$125_n$ for the NVM banks $110_0$-$110_n$. The logic blocks $121_0$-$121_n$ can receive various inputs from the cache controller 170 and, in response, can generate and output (i.e., can be configured to generate and output) digital control signals ($A_0$-$A_n$) $122_0$-$122_n$ and inverted digital control signals ($Ab_0$-$Ab_n$) $123_0$-$123_n$ to the bias voltage selectors $125_0$-$125_n$, respectively. The digital control and inverted digital control signals $122_0$-$122_n$ and $123_0$-$123_n$ are received by the bias voltage selectors $125_0$-$125_n$ and, based thereon, the bias voltage selectors $125_0$-$125_n$ can switch (i.e., can be configured to switch) the back biasing voltages $126_0$-$126_n$ between the RBB voltage and the FBB voltage.

Figure 7:
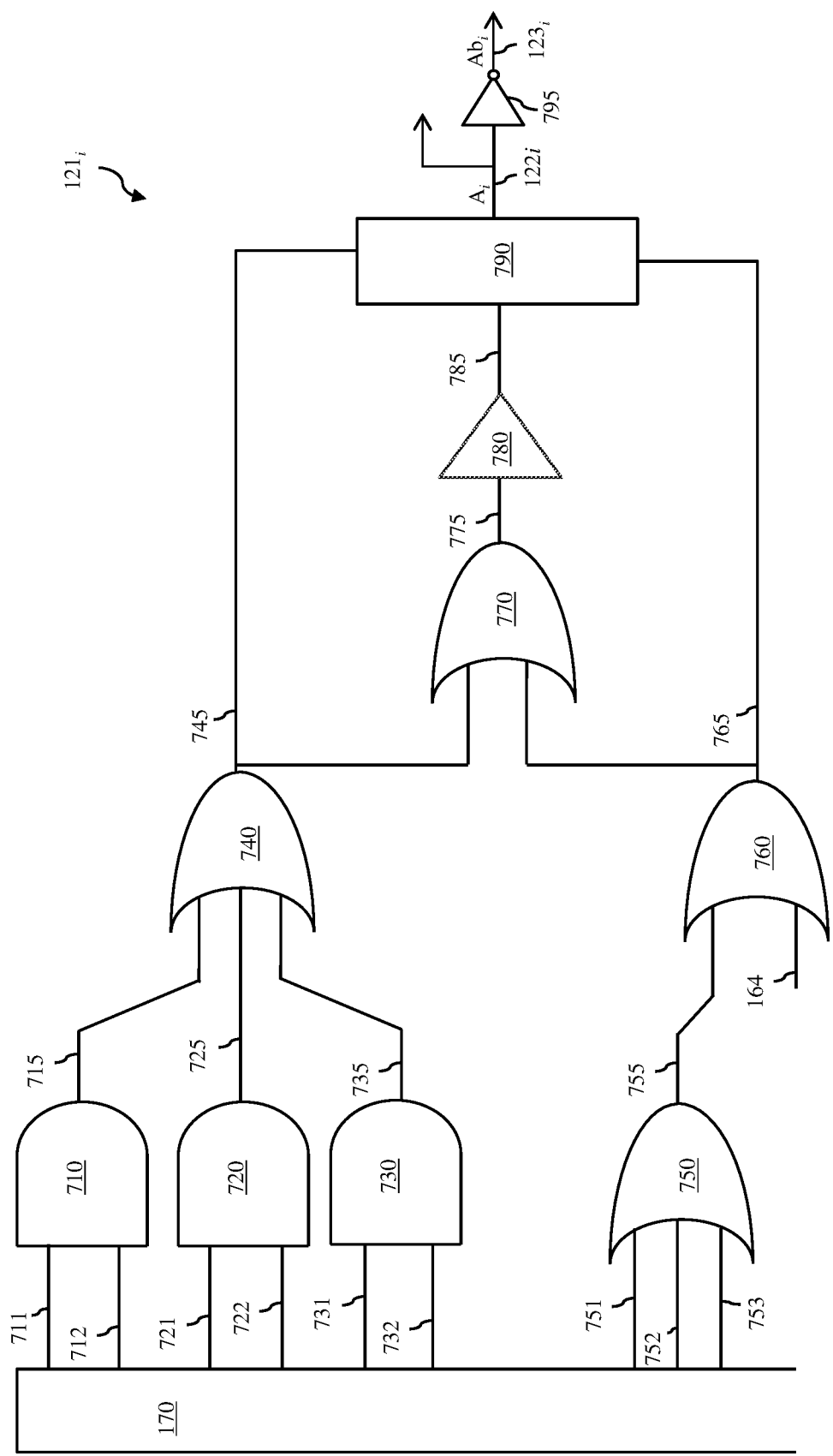
FIG. 7 is a schematic diagram illustrating an example of a logic block that can be incorporated into the bias control circuit of the NVM structure of FIG. 1B.
Figure 8:
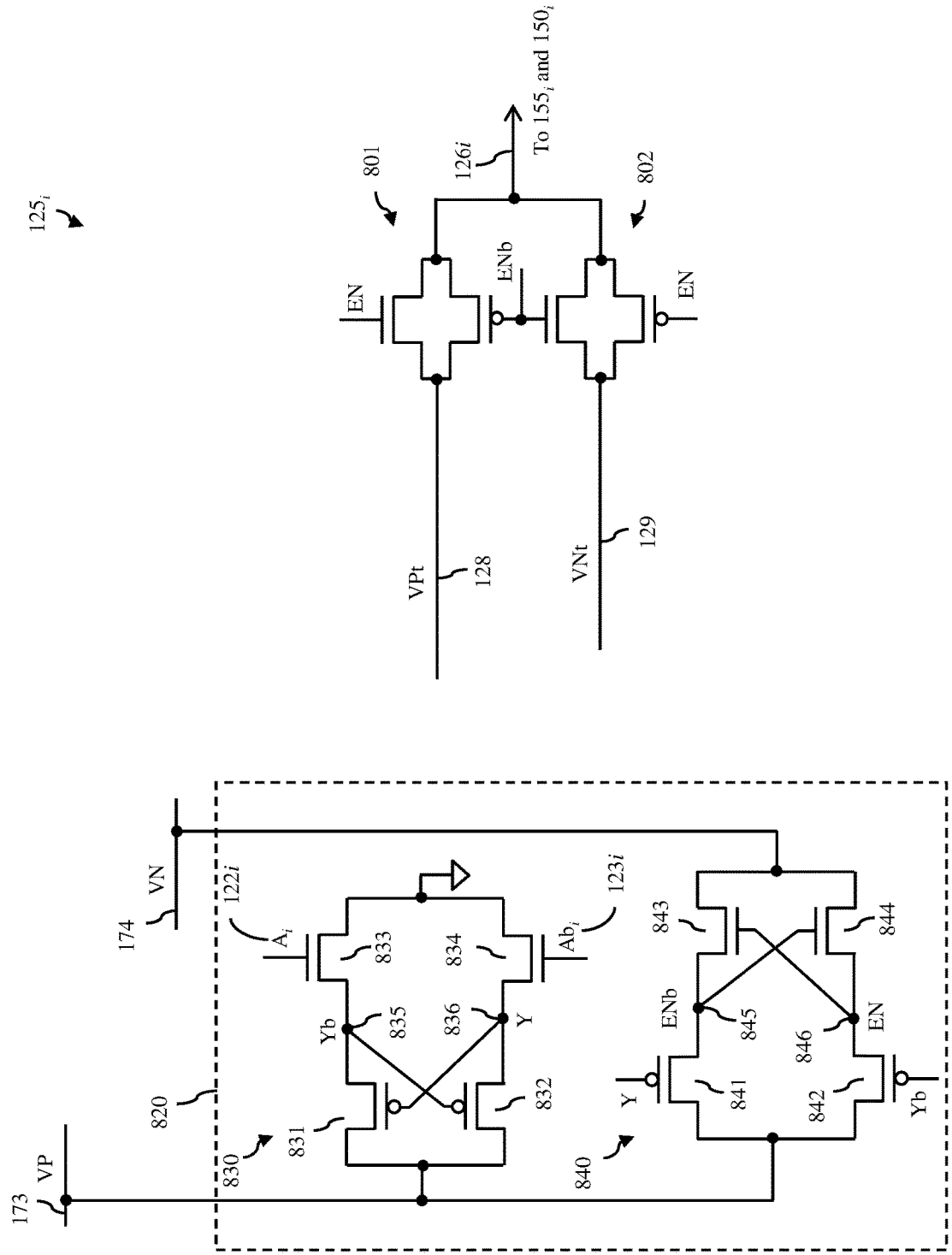
FIG. 8 is a schematic diagram illustrating an example of a bias voltage selector that can be incorporated into the bias control circuit of the NVM structure of FIG. 1B.

FIG. 7 is a schematic diagram illustrating one example logic block for one NVM bank (referred to herein as logic block $121_i$ for NVM bank $110_i$) within the bias control circuit 120. FIG. 8 is a schematic diagram illustrating one example bias voltage selector for one NVM bank (referred to herein as bias voltage selector $125_i$ of NVM bank $110_i$) within the bias control circuit 120. It should be understood that all logic blocks and bias voltage selectors for all NVM banks within the bias control circuit 120 can have essentially the same configurations as logic block $121_i$ and bias voltage selector $125_i$.

Referring to FIG. 7 in combination with FIG. 1B, logic block $121_i$ can include first AND gates 710, 720, 730, one for each of the different caches L1, L2, L3 in the cache memory 20 of the hierarchical memory architecture 1. Each first AND gate 710, 720, 730 can have two inputs, which can be connected to the cache controller 170 and which can receive therefrom a cache-specific miss indicator 711, 721, 731 associated with the NVM bank $110_i$ and a cache-specific policy indicator 712, 722, 732, respectively. That is, first AND gate 710 can receive an L1 miss indicator 711 (which indicates whether, during an L1 cache data retrieval process, duplicate data corresponding to the memory address as that in the NVM bank $110_i$ was not found during the L1 cache retrieval process) and an L1 policy indicator 712. First AND gate 720 can receive an L2 miss indicator 721 (which indicates whether duplicate data corresponding to the same specific memory address as that in the NVM bank $110_i$ was not found during the L2 cache retrieval process) and an L2 policy indicator 712, and so on. Each first AND gate 710, 720, 730 can further have an output, which outputs a first AND gate output signal 715, 725, 735 according to a conventional AND gate truth table. That is, a first AND gate output signal will be at a high logic level (i.e., logic "1") whenever all inputs are at the high logic level and will be at a low logic level (i.e., logic "0") whenever at least one of the inputs is at the low logic level.

Logic block $121_i$ can further include a first OR gate 740. First OR gate 740 can have inputs, which are electrically connected to receive the first AND gate output signals 715, 725, 735 from the first AND gates 710, 720, 730, respectively. First OR gate 740 can further have an output, which outputs a first OR gate output signal 745 according to a conventional OR gate truth table. That is, the first OR gate output signal 745 will be at the low logic level (i.e., logic "0") whenever all inputs are at the low logic level and will be at the high logic level (i.e., logic "1") whenever at least one of the inputs is at the high logic level.

Logic block $121_i$ can further include a second OR gate 750. Second OR gate 750 can have inputs, which are electrically connected to the cache controller 170 to receive cache-specific hit indicators 751, 752, 753, respectively, for each of the caches (e.g., L1, L2, L3). That is, second OR gate 750 can receive an L1 hit indicator 751 (which indicates whether duplicate data corresponding to the same specific memory address as that in the NVM bank $110_i$ was found during the L1 cache retrieval process), an L2 hit indicator 752 (which indicates whether duplicate data corresponding to the same specific memory address as that in the NVM bank $110_i$ was found during the L2 cache retrieval process), and so on. The second OR gate 750 can further an output, which outputs a second OR gate output signal 755 according to the conventional OR gate truth table. That is, the second OR gate output signal 755 will be at the low logic level (i.e., logic "0") whenever all the inputs are at the low logic level and will be at the high logic level (i.e., logic "1") whenever at least one of the inputs is at the high logic level.

Logic block $121_i$ can further include a third OR gate 760. The third OR gate 760 can include inputs, which are electrically connected to receive the second OR gate output signal 755 from the second OR gate 750 and a data output valid indicator 164 from the NVM back $110i$, respectively. The third OR gate 760 can have an output, which outputs a third OR gate output signal 765 according to the conventional OR gate truth table. That is, the third OR gate output signal 765 will be at the low logic level (i.e., logic "0") whenever the all the inputs are at the low logic level and will be at the high logic level (i.e., logic "1") whenever at least one of the inputs is at the high logic level.

Logic block $121_i$ can further include a fourth OR gate 770. The fourth OR gate 770 can include inputs, which are electrically connected to receive the first OR gate output signal 745 and the third OR gate output signal 765, respectively. The fourth OR gate 770 can further have an output, which outputs a fourth OR gate output signal 775 according to a conventional OR gate truth table. That is, the fourth OR gate output signal 775 will be at the low logic level (i.e., logic "0") whenever all the inputs are at the low logic level and will be at the high logic level (i.e., logic "1") whenever at least one of the inputs is at the high logic level.

Logic block $121_i$ can further include a delay buffer 780 and an up/down counter 790 for the NVM bank $110_i$. The delay buffer 780 can have an input, which is electrically connected to receive the fourth OR gate output signal 775, and an output, which outputs a delayed version of the fourth OR gate output signal as a clock signal 785. The up/down counter 790 can be electrically connected to receive the first OR gate output signal 745 (also referred to herein as an up count signal), the third OR gate output signal 765 (also referred to herein as a down count signal), and the clock signal 785 and can generate and output (i.e., can be configured to generate and output) a digital control signal ($A_i$) $122_i$ based on the up and down count signals. Up/down counters (also referred to as a bidirectional counter) are known in the art and count up and down (e.g., from 0). In this up/down counter, if the count is greater than 0, then $A_i$ is 1. If the count is 0, then $A_i$ is 0. Logic block $121_i$ can further include an inverter 795 electrically connected to receive $A_i$ and configured to output an inverted digital control signal ($Ab_i$) $123_i$.

Referring to FIG. 8 in combination with FIGS. 1B and 7, bias voltage selector $125_i$ can be electrically connected to the logic block $121_i$ in order to receive the digital control signal ($A_i$) $122_i$ and the inverted digital control signal ($Ab_i$) $123_i$. The bias voltage selector $125_i$ can further be electrically connected to the maximum positive supply voltage line 173 at VP and the maximum negative supply voltage line 174 at VN. Bias voltage selector $125_i$ can include level shifter 820 and, particularly, a two-stage level shifter. This two-stage level shifter 820 can include a first stage 830 that level shifts the high voltage level of the digital control signal $A_i$ and the inverted digital control signal $Ab_i$ in a positive direction from VDD to VP. This two-stage level shifter 820 can also include a second stage 840 that level shifts the low voltage level of $A_i$ and $Ab_i$ in a negative direction from VSS to VN.

Specifically, the first stage 830 can include two first branches (i.e., a first branch and an additional first branch) connected in parallel between the VP line 128 (e.g., at an output of a positive charge pump (not shown)) so as to receive VP) and ground. The two first branches can each include series-connected P-channel and N-channel transistors (i.e., a PFET and an NFET connected in series). The gate of the PFET 831 in the first branch can be coupled to a junction 836 (which outputs an intermediate signal (Y)) between the PFET 832 and the NFET 834 in the additional first branch. Furthermore, the gate of the PFET 832 in the additional first branch can be coupled to the junction 835 (which outputs an inverted intermediate signal (Yb)) between the PFET 831 and NFET 833 in the first branch. Finally, the gates of the NFETs 833 and 834 in the two first branches can be connected to receive $A_i$ and $Ab_i$, respectively, from the logic block $121_i$. With this configuration, if $A_i$ is high (i.e., logic 1, VDD) and $Ab_i$ is low (i.e., logic 0, VSS), the NFET 833 turns on and pull Yb at junction 835 down to VSS, thereby turning on the PFET 832 so as to pull up Y (at junction 836) to VP. Thus, the high and low voltage levels of Y and Yb are VP and ground, respectively.

The second stage 840 can include two second branches (i.e., a second branch and an additional second branch) connected in parallel between the maximum positive supply voltage line 173 so as to receive VP and the maximum negative supply voltage line 174 so as to receive VN. The two second branches can each include series-connected P-channel and N-channel transistors (i.e., a PFET and an NFET connected in series). However, in this second stage 840, the gate of the NFET 843 in the second branch is coupled to a junction 846 (which outputs an enable signal (EN)) between the PFET 842 and NFET 844 in the additional second branch and the gate of the NFET 844 in the additional second branch is coupled to the junction 845 (which outputs an inverted enable signal (ENb)) between the PFET 841 and the NFET 843 in the second branch. Additionally, the gates of PFETs 841 and 842 in the two second branches are connected to the first stage 830 so as to receive Y and Yb, respectively. With this configuration, if Yb is at VSS, PFET 842 will turn on pulling up EN at junction 846 to VP, thereby turning on the NFET 843 and pulling down ENb to VN (which is a negative voltage less than ground). Thus, the high and low voltage levels of EN and ENb are VP and VN, respectively.

The bias voltage selector $125_i$ can further include a first transmission gate 801. This first transmission gate 801 can include a first N-type transistor (e.g., a first NFET) and a first P-type transistor (e.g., a first PFET), which are connected in parallel between the positive voltage supply line 128 for receiving VPt, as illustrated (or, alternatively, to the maximum positive voltage supply line 173 for receiving VP, not shown) and at least one contact region $155_i$ for the well region $150_i$ for the NVM bank $110_i$. The bias voltage selector $125_i$ can further include a second transmission gate 802. This second transmission gate 802 can include a second NFET and a second PFET, which are connected in parallel between the negative voltage supply line 129 for receiving VNt, as illustrated (or, alternatively, to the maximum negative supply voltage line 174 for receiving VN, not shown) and the same contact region(s) $155_i$. Within the bias voltage selector $125_i$ the gates of the first NFET and the first PFET of the first transmission gate 801 are electrically connected to receive EN and ENb, respectively. Additionally, the gates of the second NFET and the second PFET of the second transmission gate 802 are electrically connected to receive ENb and EN, respectively. Thus, when EN is high (i.e., and, particularly at VP) and ENb is low (i.e., particularly at VN), the first transmission gate 801 will be conductive and the second transmission gate 802 will be non-conductive. As a result, the back biasing voltage $126_i$ will be positive (i.e., a FBB voltage, when the transistors 210 are NFETs). However, when EN is low (i.e., at VN) and ENb is high (i.e., at VP), the first transmission gate 801 will be non-conductive and the second transmission gate 802 will be conductive. As a result, back biasing voltage $126_i$ will be negative (i.e., a RBB voltage, when the transistors 210 of the NVM cells 101 are NFETs).

Referring to FIGS. 1B and 7-8 in combination, in operation, cache-specific policy indicators 712, 722, 732 received by the first AND gates 710, 720, 730 from the cache controller 170 can be set at the high logic level (i.e., high or at a logic "1"). Additionally, the data output valid indicator 164 will be at a low logic value (i.e., low or at a logic "0") until such time as the NVM bank has been accessed and a data output signal (Dout) 161, which is deemed to be valid, has been output. Upon receipt of an access request associated with NVM bank 110i (e.g., as indicated by bank address information $162_i$ received by the bias control circuit 120) a cache data retrieval process can be automatically initiated by cache controller 170. In this cache data retrieval process, the different caches (L1, L2, etc.) can be accessed sequentially. That is, an L1 data retrieval process can be performed. If duplicate data (associated with the memory address, including the ID for NVM bank 110i) is not found stored in L1, a L1 miss indicator 711 output to logic block 121$_i$ from the cache controller 170 can go high, while L2 and L3 miss indicators 721, 731 remain low. In this case, the first AND gate output signal 715 from the first AND gate 710 will go high and the first AND gate output signals 725 and 735 from the first AND gates 720 and 730 will remain low. As a result, first OR gate output signal 745 from the first OR gate 740 will go high (because at least one of its inputs is high). Additionally, since at this point in the cache data retrieval process, duplicate data has not been found in any of the other caches, cache-specific hit indicators 751, 752, 753 will remain low and the second OR gate output signal 755 will be low. Furthermore, since the second OR gate output signal 755 is low and the data output valid indicator 164 is also still low, the third OR gate output signal 765 will remain low. With first OR gate output signal 745 (up count signal) being high and third OR gate output signal 765 (down count signal) being low, the count by the up/down counter 790 will go up and be greater than 0. So, $A_i$ 122$_i$ will go high. If $A_i$ 122$_i$ switches to high, then within the bias voltage selector 125$_i$ EN will go high, first transmission gate 801 will be conductive and well region 150$_i$ will receive a positive bias voltage so NFETs thereon will be forward back biased.

However, if during the same cache data retrieval process duplicate data (associated with the memory address, including the ID for NVM bank 110$i$) is found in any of the caches (L1, L2, L3), then cache-specific miss indicators 711, 721, 731 will all stay low and an appropriate one of the cache-specific hit indicators 751, 752 or 753 (i.e., the hit indicator for the cache where the hit occurred) will go high. Thus, the first AND gate output signals 715, 725, 735 from the first AND gates 710, 720, 730 will all be low and the first OR gate output signal 745 from the first OR gate 740 will also be low. Additionally, the second OR gate output signal 755 from the second OR gate 750 will go high (because one of the hit indicators is high). Thus, the third OR gate output signal 765 from the third OR gate 760 will also be high. With first OR gate output signal 745 (up count signal) being low and third OR gate output signal 765 (down count signal) being high, the count by the up/down counter 790 will go down to 0. So, $A_i$ 122$_i$ will go low. If $A_i$ 122$_i$ is low, then within the bias voltage selector 125$_i$ EN will go low, second transmission gate 802 will be conductive, and well region 150$_i$ will receive a negative bias voltage so NFETs thereon will be reverse back biased.

It should be noted that, given the logic block 121$i$ described above, if the L1 hit indicator goes high and the L1 miss indicator stays low during the cache data retrieval process, then $A_i$ 122$_i$ will stay low and the back biasing voltage 126$i$ will remain negative. Thus, no FBB is performed in response to an access request. As mentioned above, if the L1 hit indicator stays low and the L1 miss indicator goes high during the cache data retrieval process, then $A_i$ 122$_i$ goes high and the back biasing voltage 126$_i$ will be positive for FBB. However, if subsequently duplicate data is found in either L2 or L3, then $A_i$ 122$_i$ will switch back to low and the back biasing voltage 126$_i$ will switch back to negative (because access to the NVM bank 110$i$ is no longer required). Furthermore, if duplicate data is not found in any of the caches, the NVM bank 110$i$ (where the well region 150$_i$ below the transistor array is biased to VP) will be accessed and a data output signal (Dout) 161 corresponding to a stored data value can be output. If Dout 161 is deemed valid, the data output valid indicator 164 will go high. As a result, the NVM bank 110$_i$ will switch back to the standby state. Furthermore, the third OR gate output signal 765 will go high (because at least one of the inputs is high). As a result, $A_i$ 122$_i$ will again go low such that the back biasing voltage 126$_i$ switches back to negative for RBB.

Thus, in the disclosed embodiments, only transistors 210 in transistor arrays of NVM cell arrays of NVM banks that have been identified (per a memory address in an access request) as potentially becoming operational (e.g., if data is not found during a corresponding cache data retrieval process within the hierarchical memory architecture 1) are forward back biased. All other transistors 210 of all other transistor arrays of NVM cell arrays of all other NVM banks are reverse back biased. As a result, leakage power consumption across the multi-bank NVM structure is reduced. Furthermore, since such forward back biasing is initiated during the cache data retrieval process, VP biasing of the well region at issue can be achieved at or before the time when NVM bank access is actually required. As a result, data access latency is reduced by access time reduction due to forward bias. Furthermore, if it is determined during the cache data retrieval process that NVM bank access is not required, reverse back biasing of the well region at issue can be instituted, thereby minimizing any power loss.

It should be understood that in the structures and method described above, a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   well regions within a semiconductor substrate;
   an insulator layer on the semiconductor substrate over the well regions;
   memory banks, wherein each memory bank includes a corresponding well region of the well regions and an array of non-volatile memory cells including transistors on the insulator layer above the corresponding well region; and
   a bias control circuit connected to the well regions, wherein the bias control circuit outputs back biasing voltages for the memory banks to the well regions and independently switches the back biasing voltages between a reverse back biasing voltage and a forward back biasing voltage.

2. The structure of claim 1, wherein the bias control circuit independently switches the back biasing voltages so the forward back biasing voltage is output only to the corresponding well region of a memory bank indicated in an access request and the reverse back biasing voltage is output to all corresponding well regions of all other memory banks.

3. The structure of claim 1,
   wherein the bias control circuit includes bias voltage selectors for the memory banks connected to the well regions,
   wherein each bias voltage selector for each memory bank includes:
      a two-stage voltage level shifter connected to a positive voltage line at a positive voltage level higher than a positive supply voltage level and a negative voltage line at a negative voltage level lower than ground, wherein the two-stage voltage level shifter receives a digital control signal and an inverted digital control signal that transition between the positive supply voltage level and ground and outputs an enable signal and an inverted enable signal that transition between the positive voltage level and the negative voltage level;
      a first transmission gate connected between the positive voltage line and at least one well contact region for the corresponding well region of the memory bank; and
      a second transmission gate connected between the negative voltage line and the at least one well contact region, and
   wherein the first transmission gate and the second transmission gate are controlled by the enable signal and the inverted enable signal so only one of the first transmission gate and the second transmission gate is conductive.

4. The structure of claim 1,
   wherein each non-volatile memory cell includes an N-type transistor and a programmable resistor connected in series between a supply line and a bitline, and
   wherein the reverse back biasing voltage is a negative voltage, and the forward back biasing voltage is a positive voltage.

5. The structure of claim 4, wherein the programmable resistor includes a magnetic tunnel junction-type programmable resistor.

6. The structure of claim 4, wherein the programmable resistor includes any of a phase change memory-type programmable resistor and a resistive random access memory-type programmable resistor.

7. A structure comprising:
well regions within a semiconductor substrate;
an insulator layer on the semiconductor substrate over the well regions;
memory banks, wherein each memory bank includes a corresponding well region and an array of non-volatile memory cells including transistors on the insulator layer above the corresponding well region; and
a bias control circuit connected to the well regions,
wherein the bias control circuit outputs back biasing voltages for the memory banks to the well regions and independently switches the back biasing voltages between a reverse back biasing voltage and a forward back biasing voltage based on addresses in access requests and further based on results of cache data retrieval processes performed in response to the access requests.

8. The structure of claim 7, wherein the bias control circuit independently switches a back biasing voltage for a memory bank from the reverse back biasing voltage to the forward back biasing voltage in response to a first cache miss indicator and further switches the back biasing voltage for the memory bank from the forward back biasing voltage to the reverse back biasing voltage in response to any of a cache hit indicator from any other cache and a data output valid indicator from the memory bank.

9. The structure of claim 8, wherein, by switching to the forward back biasing voltage in response to the first cache miss indicator, data access latency is reduced.

10. The structure of claim 7,
wherein the bias control circuit includes bias voltage selectors for the memory banks connected to the well regions, respectively,
wherein each bias voltage selector for each memory bank includes:
a two-stage voltage level shifter connected to a positive voltage line at a positive voltage level higher than a positive supply voltage level and a negative voltage line at a negative voltage level lower than ground, wherein the two-stage voltage level shifter receives a digital control signal and an inverted digital control signal that transition between the positive supply voltage level and ground and outputs an enable signal and an inverted enable signal that transition between the positive voltage level and the negative voltage level;
a first transmission gate connected between the positive voltage line and at least one well contact region for the corresponding well region of the memory bank; and
a second transmission gate connected between the negative voltage line and the at least one well contact region, and
wherein the first transmission gate and the second transmission gate are controlled by an enable signal and an inverted enable signal so only one of the first transmission gate and the second transmission gate is conductive.

11. The structure of claim 10,
wherein the bias control circuit further includes logic blocks for the memory banks connected to the bias voltage selectors for the memory banks, respectively,
wherein each logic block for each memory bank is connected to receive hit and miss inputs from a cache controller during the cache data retrieval processes, and
wherein the hit and miss inputs indicate whether any of multiple caches controlled by the cache controller currently store a data value that is a duplicate of a data value associated with an address in an access request.

12. The structure of claim 7, wherein each non-volatile memory cell includes an N-type transistor and a programmable resistor connected in series between a supply line and a bitline, wherein the reverse back biasing voltage is a negative voltage, and the forward back biasing voltage is a positive voltage.

13. The structure of claim 12, wherein the programmable resistor includes a magnetic tunnel junction-type programmable resistor.

14. The structure of claim 12, wherein the programmable resistor includes any of a phase change memory-type programmable resistor and a resistive random access memory-type programmable resistor.

15. A structure comprising:
well regions within a semiconductor substrate;
an insulator layer on the semiconductor substrate over the well regions;
memory banks, wherein each memory bank includes a corresponding well region and an array of non-volatile memory cells including transistors on the insulator layer above the corresponding well region;
a bias control circuit including:
bias voltage selectors for the memory banks connected to the well regions, respectively; and
logic blocks for the memory banks connected to the bias voltage selectors, respectively, and
a cache controller connected to the logic blocks,
wherein the bias voltage selectors output back biasing voltages for the memory banks to the well regions, and
wherein the logic blocks cause the bias voltage selectors to independently switch the back biasing voltages between a reverse back biasing voltage and a forward back biasing voltage based on addresses in access requests and further in response to inputs received from the cache controller indicating results of cache data retrieval processes performed in response to the access requests.

16. The structure of claim 15, wherein, within the bias control circuit, a back bias selector for a memory bank independently switches a back biasing voltage for the memory bank from the reverse back biasing voltage to the forward back biasing voltage in response to a first cache miss indicator from the cache controller and further switches the back biasing voltage for the memory bank from the forward back biasing voltage to the reverse back biasing voltage in response to any of a cache hit indicator from any other cache and a data output valid indicator from the memory bank.

17. The structure of claim 16, wherein, by switching to the forward back biasing voltage in response to the first cache miss indicator, data access latency is reduced.

18. The structure of claim 15, wherein, within the bias control circuit, a logic block for a memory bank includes:
first AND gates for different caches, each first AND gate receiving a cache-specific miss indicator for the memory bank and a cache-specific policy indicator and outputting a first AND gate output signal;
a first OR gate receiving first AND gate output signals and outputting a first OR gate output signal;

a second OR gate receiving cache-specific hit indicators for the memory bank and outputting a second OR gate output signal;

a third OR gate receiving the second OR gate output signal and a data output valid indicator from the memory bank and outputting a third OR gate output signal;

a fourth OR gate receiving the first OR gate output signal and the third OR gate output signal and outputting a fourth OR gate output signal;

a buffer receiving the fourth OR gate output signal and outputting a clock signal;

a counter receiving the first OR gate output signal, the third OR gate output signal, and the clock signal and outputting a digital control signal for the memory bank; and an inverter receiving the digital control signal and outputting an inverted digital control signal, wherein the digital control signal and the inverted digital control signal transition between a positive supply voltage level and ground.

19. The structure of claim 18,
wherein, within the bias control circuit, a bias voltage selector for the memory bank includes:
a two-stage voltage level shifter connected to a positive voltage line at a positive voltage level higher than the positive supply voltage level and a negative voltage line at a negative voltage level lower than ground, wherein the two-stage voltage level shifter receives the digital control signal and the inverted digital control signal and outputs an enable signal and an inverted enable signal that transition between the positive voltage level and the negative voltage level;

a first transmission gate including a first N-type transistor and a first P-type transistor connected in parallel between the positive voltage line and at least one well contact region for a well region; and a second transmission gate including a second N-type transistor and a second P-type transistor connected in parallel between the negative voltage line and the well contact region, and wherein gates of the first N-type transistor and the first P-type transistor receive the enable signal and the inverted enable signal, respectively and gates of the second N-type transistor and the second P-type transistor receive the inverted enable signal and the enable signal, respectively, so only one of a positive voltage and a negative voltage are supplied to the well region.

20. The structure of claim 15, wherein each non-volatile memory cell includes an N-type transistor and a programmable resistor connected in series between a supply line and a bitline, and wherein the reverse back biasing voltage is a negative voltage, and the forward back biasing voltage is a positive voltage.

* * * * *